(12) United States Patent
Oka

(10) Patent No.: US 9,450,009 B2
(45) Date of Patent: Sep. 20, 2016

(54) SOLID-STATE IMAGING DEVICE AND CAMERA SYSTEM

(71) Applicant: c/o SONY CORPORATION, Tokyo (JP)

(72) Inventor: Osamu Oka, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/867,575

(22) Filed: Sep. 28, 2015

(65) Prior Publication Data
US 2016/0099275 A1  Apr. 7, 2016

Related U.S. Application Data

(63) Continuation of application No. 13/764,448, filed on Feb. 11, 2013, now Pat. No. 9,171,968.

(30) Foreign Application Priority Data

Mar. 15, 2012 (JP) ................. 2012-059247

(51) Int. Cl.
| | | |
|---|---|---|
| H01L 27/146 | (2006.01) | |
| H01L 31/02 | (2006.01) | |
| H01L 23/00 | (2006.01) | |
| H01L 27/144 | (2006.01) | |
| H04N 5/374 | (2011.01) | |
| H04N 5/378 | (2011.01) | |
| H01L 23/58 | (2006.01) | |
| H01L 25/00 | (2006.01) | |

(52) U.S. Cl.
CPC ....... *H01L 27/14634* (2013.01); *H01L 23/562* (2013.01); *H01L 27/1446* (2013.01); *H01L 27/1469* (2013.01); *H01L 27/14632* (2013.01); *H01L 27/14636* (2013.01); *H01L 27/14643* (2013.01); *H01L 31/02* (2013.01); *H04N 5/374* (2013.01); *H04N 5/378* (2013.01); *H01L 23/585* (2013.01); *H01L 25/50* (2013.01); *H01L 2924/0002* (2013.01)

(58) Field of Classification Search
CPC ............... H01L 23/522; H01L 21/768; H01L 27/14632; H01L 27/14634; H01L 27/14643; H01L 27/14636; H04N 5/374; H04N 5/378
USPC .......... 257/758, E23.145, E21.585; 438/637
See application file for complete search history.

(56) References Cited

U.S. PATENT DOCUMENTS

| | | | | |
|---|---|---|---|---|
| 2004/0095495 A1* | 5/2004 | Inokuma | ............... | H04N 5/2253 348/308 |
| 2005/0093169 A1* | 5/2005 | Kajita | ................... | H01L 23/562 257/774 |
| 2010/0059818 A1* | 3/2010 | Sasaki | ................. | H01L 29/0634 257/339 |
| 2010/0109006 A1* | 5/2010 | Kobayashi | .............. | H01L 24/48 257/48 |
| 2010/0155582 A1* | 6/2010 | Hirano | .............. | H01L 27/14636 250/227.11 |
| 2011/0127631 A1* | 6/2011 | Kawashima | ...... | H01L 27/14603 257/466 |
| 2011/0186917 A1* | 8/2011 | Akiyama | ................ | H01L 21/76 257/292 |
| 2011/0266679 A1* | 11/2011 | Hotta | .................... | H01L 23/585 257/758 |

* cited by examiner

*Primary Examiner* — Kenneth Parker
*Assistant Examiner* — Bo Fan
(74) *Attorney, Agent, or Firm* — Chip Law Group

(57) ABSTRACT

There is provided a solid-state imaging device including a wafer in which a guard ring with conductivity in an insulation film layered on a first conductivity type substrate is formed between an edge portion of at least a first chip, out of the first chip and a second chip of a layered chip, and a scribe line region, at least two second conductivity type layers are formed at an interval within a region corresponding to the guard ring, in the first conductivity type substrate, and the guard ring includes a first guard ring part connected to one of the second conductivity type layers on a chip edge portion side, and a second guard ring part connected to another one of the second conductivity type layers on a scribe line side.

6 Claims, 19 Drawing Sheets

SOLID-STATE IMAGING DEVICE AND CAMERA SYSTEM

BACKGROUND

The present technology relates to a solid-state imaging device and a camera system which device has a layered structure consisted of two chips and is formed by dividing a wafer into pieces due to dicing.

Typically, an image capturing device is obtained by assembling individual packages, as modules, in which two chips of a CMOS image sensor (CIS) chip and an image processing chip are mounted, respectively.

Or, there is also a case of each of the chips undergoing COB (Chip On Board) packaging.

In case of an image capturing device mounted in a mobile phone or the like, reduction in packaging area and miniaturization are expected recent years, and thus, SOC (System On Chip) technology for integrating the above-mentioned two chips into one chip is developed.

However, process for the integration into one chip in which process CIS process and hi-speed logic process are mixed expects increased steps and costs high, and in addition, is difficult to manage both analog characteristics and logic characteristics, this leading to the risk of deterioration of characteristics of the image capturing device.

Therefore, a method for managing both miniaturization and improvement in characteristics due to a layered structure obtained by chip-level assembling of the above-mentioned two chips is proposed (see, Japanese Patent Laid-Open No. 2004-146816 and Japanese Patent Laid-Open No. 2008-085755).

Portions (A) and (B) of FIG. 1 illustrate a process flow of a solid-state imaging device with a layered structure.

As illustrated in portion (A) of FIG. 1, after wafers 1 and 2 prepared with processes most suitable for respective upper and lower first and second chips are pasted together, the rear face of the upper chip is polished and the thickness of the wafer of the upper chip is made thinner.

Signal lines and power supply lines between the upper and lower chips are electrically joined through via holes (TCV: Through Chip Via) whose through holes are filled with metal.

Then, as illustrated in portion (B) of FIG. 1, after performing processing to obtain color filters and microlenses on the first chip (upper chip) side, chips are cut out by dicing.

FIG. 2 is a diagram for explaining a typical method of cutting out chips by dicing. Moreover, CW in FIG. 2 denotes a cutting width with a blade.

The wafer with the layered structure in which chips CP are arranged in an array shape is cut with a blade along scribe lines SCL indicating positions for cutting between the chips, and is divided into the individual chips CP.

In FIG. 2, a simplified cross section taken along the scribe line SCL which is the position for cutting is partially enlarged and illustrated.

In the layered structure in FIG. 2, a silicon (Si) layer 11 and a nitride film (for example, SiN film) 12 are layered to form the CIS-side wafer 1. In practice, sensors and the like are formed on the other face side opposite to the face of the Si layer 11 on which the SiN film is formed.

A silicon layer 21, an oxide film 22, a wiring (for example, copper) layer 23, an $SiO_2$ layer 24 and an $SiO_2$ layer 25 are layered to form the logic-side wafer 2.

Furthermore, in the simplified structure in FIG. 2, the SiN film 12 of the CIS-side wafer 1 and the $SiO_2$ layer 25 of the logic-side wafer 2 are pasted together.

Furthermore, in the CIS-side wafer 1 and logic-side wafer 2, guard rings GDR1 and GDR2 for preventing cracks from propagating to the chip side, and the like, are formed in regions of the scribe lines SCL which regions are near the chips.

Dicing includes blade dicing after laser ablation, stealth dicing, and the like other than the above-mentioned blade dicing solely with a blade.

SUMMARY

Incidentally, as mentioned above, in the layered structure in which the CIS-side n-type substrate and the logic-side p-type substrate are layered and electrically connected through the TCV, there is sometimes a case that the TCV and Si connect with each other not via the insulation film due to malformation of the TCV in the vicinity of the outermost of the wafers.

This malformation originates from the process and is difficult to be excluded completely.

In this case, as illustrated in FIG. 3(A), the upper and lower wafers electrically make shorts via the TCV-Si.

Especially, in the case that the upper and lower wafers are driven at different potentials, current flows between the wafers which current is observed as standby (STB) leak in measurement before shipping and affects the measurement.

Furthermore, in the case of no separation between the chips, the above-mentioned current is observed also in multi-measurement and affects the measurement.

Moreover, in the case that blade dicing after laser ablation is employed as dicing, there are the following disadvantages.

FIG. 3(B) is a diagram for explaining a problem of the blade dicing after laser ablation.

As illustrated in FIG. 3(B), performing the laser ablation makes the Si residue sinters which are so-called debris DB and make a short circuit (short) between the CIS-side substrate and logic-side substrate.

Caused by this, the standby leak becomes large in measurement before shipping and measurement of assembled chips and affects other measurements.

Accordingly, in the present circumstances, the measurements are conducted under limitation of current values in consideration of the influence on other measurement items.

It is desirable to provide a solid-state imaging device and a camera system capable of preventing the influence of leak between two substrates which are layered, and therefore, suppressing the influence on measurement before shipping.

According to a first embodiment of the present disclosure, there is provided a solid-state imaging device including a wafer including first chips each having a pixel part in which a plurality of pixels performing photoelectric conversion are arranged and which is formed in a first conductivity type substrate, second chips each having a logic part, in which a pixel signal readout part reading out a pixel signal from the pixel part is formed in a second conductivity type substrate, and layered chips each having a layered structure in which the first chip and the second chip are pasted together, the layered chips being arranged in an array shape. In the wafer, a wiring between the first chip and the second chip is connected through a via hole formed in the first chip, a scribe line region for cutting is provided between the layered chips, a guard ring with conductivity in an insulation film layered on the first conductivity type substrate is formed between an edge portion of at least the first chip, out of the first chip and the second chip of the layered chip, and the scribe line region, at least two second conductivity type layers are formed at an interval within a region corresponding to the guard ring, in the first conductivity type substrate, and the guard ring includes a first guard ring part connected to one of the second conductivity type layers on a chip edge portion side, and a second guard ring part connected to another one of the second conductivity type layers on a scribe line side.

According to a second embodiment of the present disclosure, there is provided a solid-state imaging device including a first chip having a pixel part in which a plurality of pixels performing photoelectric conversion are arranged and which is formed in a first conductivity type substrate, a second chip having a logic part, in which a pixel signal readout part reading out a pixel signal from the pixel part is formed in a second conductivity type substrate, and a layered chip having a layered structure in which the first chip and the second chip are pasted together. A wiring between the first chip and the second chip is connected through a via hole formed in the first chip. A guard ring with conductivity in an insulation film layered on the first conductivity type substrate is formed between an edge portion of at least the first chip, out of the first chip and the second chip of the layered chip, and a cutting edge portion of the chip. At least two second conductivity type layers are formed at an interval within a region corresponding to the guard ring, in the first conductivity type substrate. The guard ring includes a first guard ring part connected to one of the second conductivity type layers on a chip edge portion side, and a second guard ring part connected to another one of the second conductivity type layers on a cutting edge portion side.

According to a third embodiment of the present disclosure, there is provided a camera system including a solid-state imaging device, and an optical system imaging a subject image in the solid-state imaging device. The solid-state imaging device includes a first chip having a pixel part in which a plurality of pixels performing photoelectric conversion are arranged and which is formed in a first conductivity type substrate, a second chip having a logic part, in which a pixel signal readout part reading out a pixel signal from the pixel part is formed in a second conductivity type substrate, and a layered chip having a layered structure in which the first chip and the second chip are pasted together. A wiring between the first chip and the second chip is connected through a via hole formed in the first chip. A guard ring with conductivity in an insulation film layered on the first conductivity type substrate is formed between an edge portion of at least the first chip, out of the first chip and the second chip of the layered chip, and a cutting edge portion of the chip. At least two second conductivity type layers are formed at an interval within a region corresponding to the guard ring, in the first conductivity type substrate. The guard ring includes a first guard ring part connected to one of the second conductivity type layers on a chip edge portion side, and a second guard ring part connected to another one of the second conductivity type layers on a cutting edge portion side.

According to the present technology, the influence of leak between two substrates which are layered can be prevented, and therefore, the influence on measurement before shipping can be suppressed.

DETAILED DESCRIPTION OF THE EMBODIMENT(S)

Figure 1:
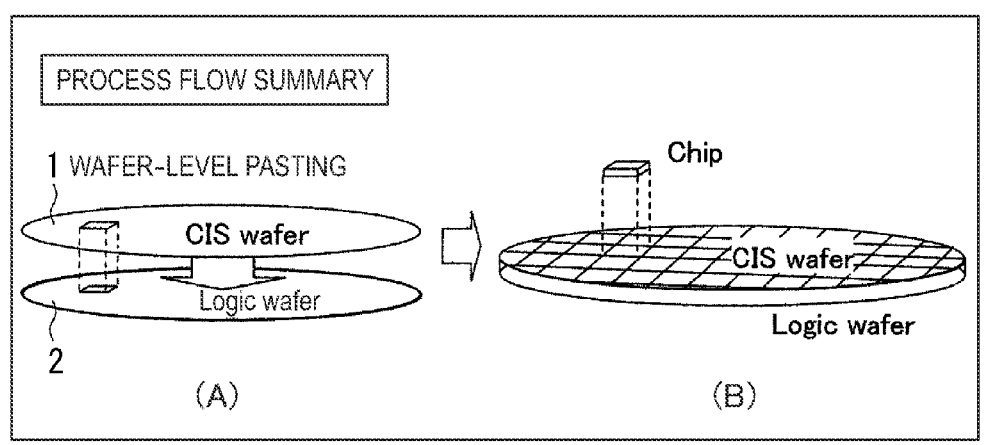
FIG. 1 is a diagram illustrating a process flow of a solid-state imaging device with a layered structure.
Figure 2:
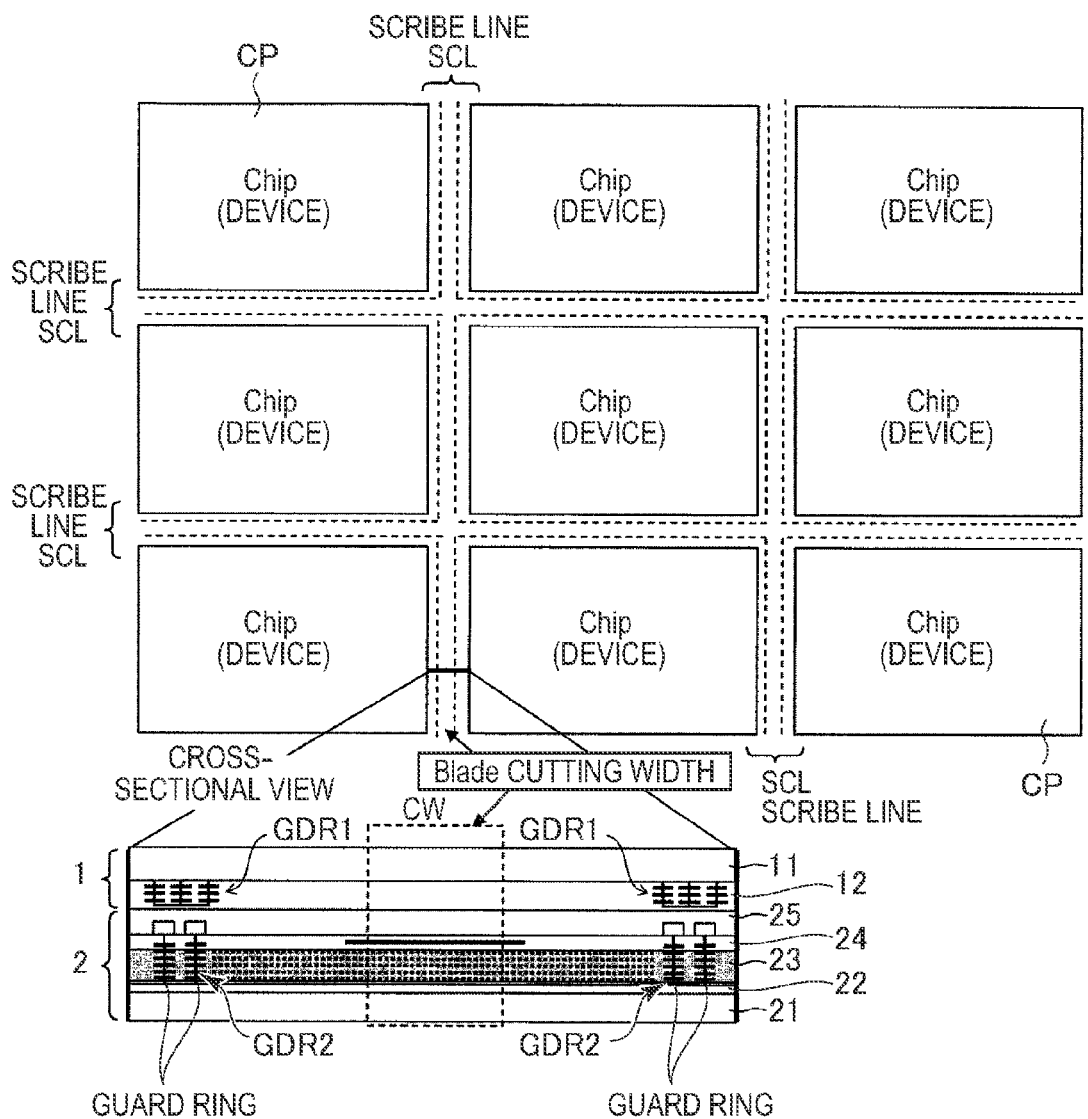
FIG. 2 is a diagram for explaining a typical method of cutting out chips by dicing.
Figure 3B:
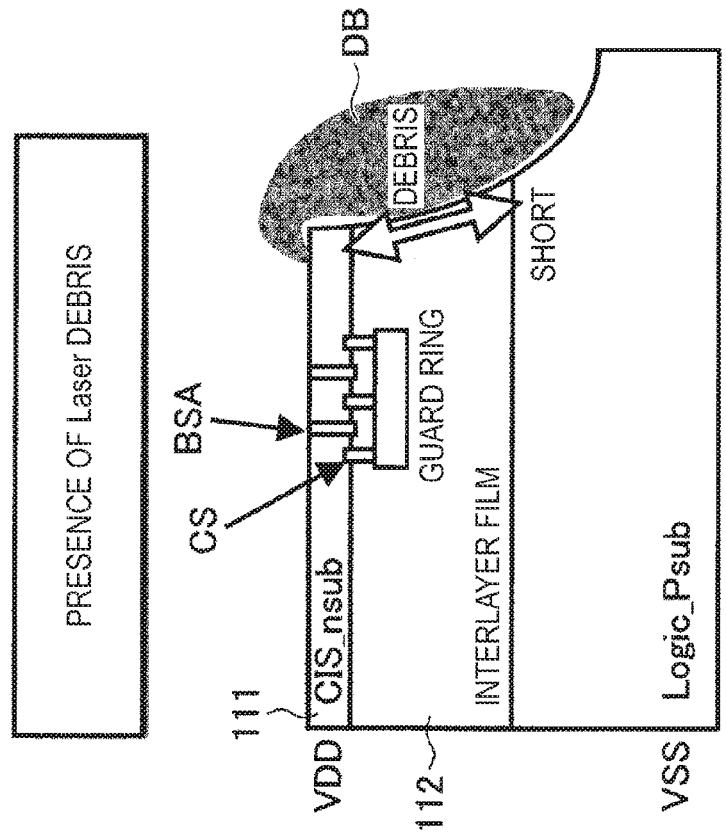
FIGS. 3(A) and 3(B) are diagrams for explaining problems of leak between the chips and blade dicing after laser ablation.
Figure 3A:
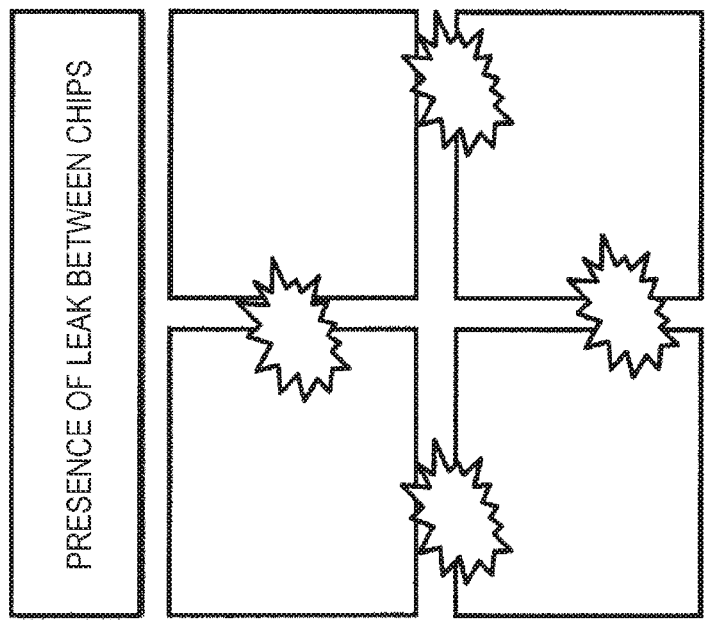

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Incidentally, the description is made in the following order.
1. Layered Structure of Solid-State Imaging Device 2. Basic Process Flow of Solid-State Imaging Device 3. First Characteristic Exemplary Configuration of Solid-State Imaging Device 4. Second Characteristic Exemplary Configuration of Solid-State Imaging Device 5. Third Characteristic Exemplary Configuration of Solid-State Imaging Device 6. Fourth Characteristic Exemplary Configuration of Solid-State Imaging Device 7. Summary of Solid-State Imaging Device 8.
Exemplary Configuration of Camera System <1. Layered Structure of Solid-State Imaging Device>

Figure 4:
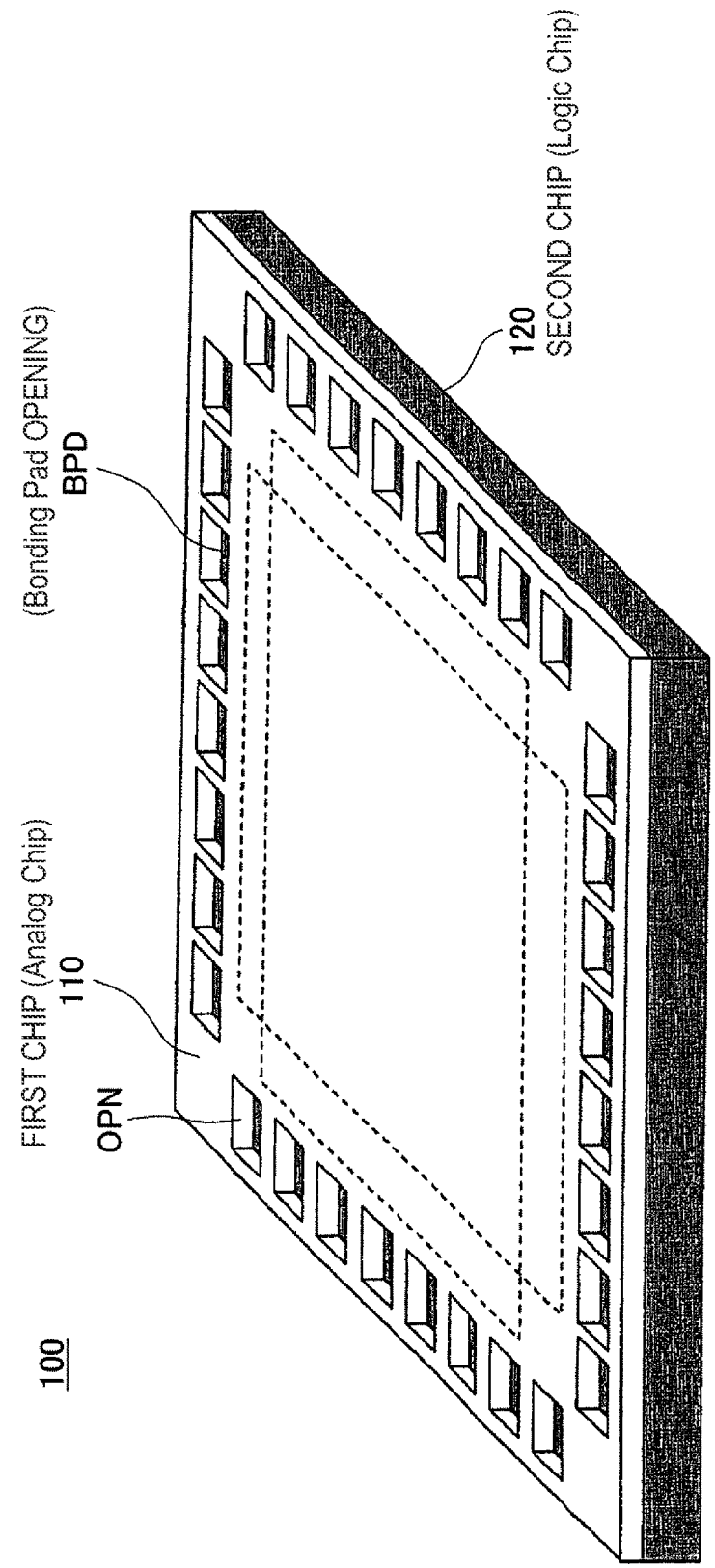
FIG. 4 is a diagram illustrating one example of a layered structure of a solid-state imaging device according to an embodiment.

FIG. 4 is a diagram illustrating one example of a layered structure of a solid-state imaging device according to an embodiment.

A solid-state imaging device 100 according to the embodiment has a plurality of pixels (sensors) which have photoelectric transducers and the like and are arranged in an array shape.

As illustrated in FIG. 4, the solid-state imaging device 100 has a layered structure of a first chip (upper chip) 110 and a second chip (lower chip) 120.

The layered first chip 110 and second chip 120 are electrically connected to each other through via holes (TCV) formed in the first chip 110.

This solid-state imaging device 100 is formed as a semiconductor device which is a layered chip with a layered structure and which is obtained by cutting due to dicing after wafer-level pasting.

In the layered structure of the upper and lower two chips, the first chip 110 is configured of an analog chip (sensor chip) in which a pixel array including the plurality of pixels in an array shape is disposed.

The second chip 120 is configured of a logic chip (digital chip) including a circuit performing quantization on analog signals transferred from the first chip 110 via the TCV and a signal processing circuit (logic circuit).

Bonding pads BPD and an input/output circuit are formed in the second chip 120. Openings OPN for wire bonding with the second chip 120 are formed in the first chip 110.

Electric connection between the first chip 110 and second chip 120 is realized, for example, through the via holes (TCV).

Arrangement positions of the TCV (via holes) are between chip ends or pads (PAD) and a circuit region.

For example, TCVs for control signals and power supply are concentrated mainly at four corners of the chip, so that a signal wiring region of the first chip 110 can be reduced.

Against the problem that a power supply line resistance increases and IR-Drop increases due to reduction of a wiring layer number of the first chip 110, efficiently arranging the TCV enables measure for noise, enhancement for stable supply and the like as to the power supply of the first chip 110 using wirings of the second chip 120.

Figure 5:
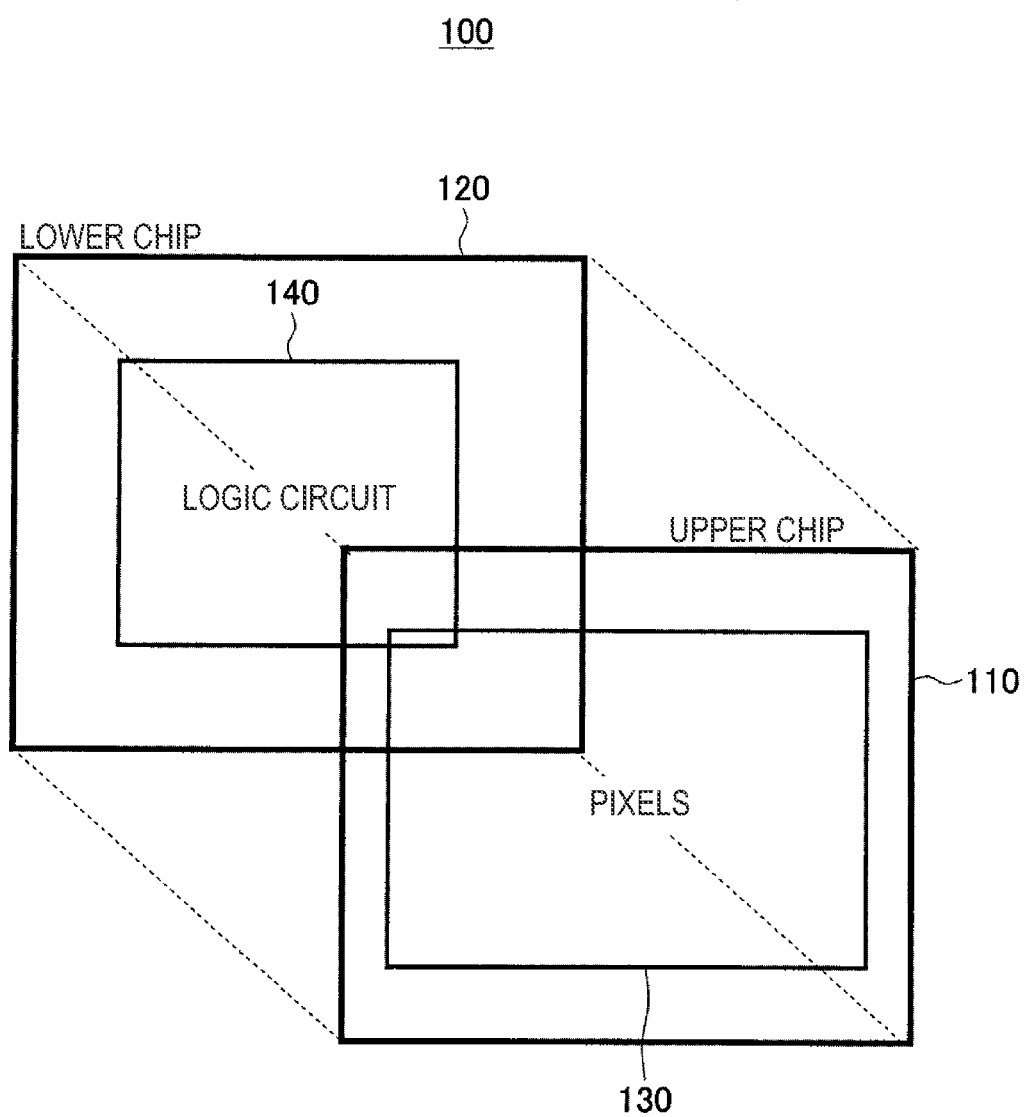
FIG. 5 is a diagram illustrating an arrangement example of a circuit and the like of the solid-state imaging device having the layered structure of two chips according to the embodiment.

FIG. 5 is a diagram illustrating an arrangement example of a circuit and the like of the solid-state imaging device having the layered structure (layered chip) of two chips according to the embodiment.

As illustrated in FIG. 5, the solid-state imaging device 100 includes a pixel part 130 disposed in the first chip 110 which is an analog chip. The solid-state imaging device 100 has a logic circuit 140, an internal power supply for the logic circuit, and the like, these disposed in the second chip 120 which is a digital chip.

Hereafter, a basic process flow and characteristic configurations of the solid-state imaging device 100 according to the embodiment having the above-mentioned layered structure are described.

<2. Basic Process Flow of Solid-State Imaging Device>

Figure 6:
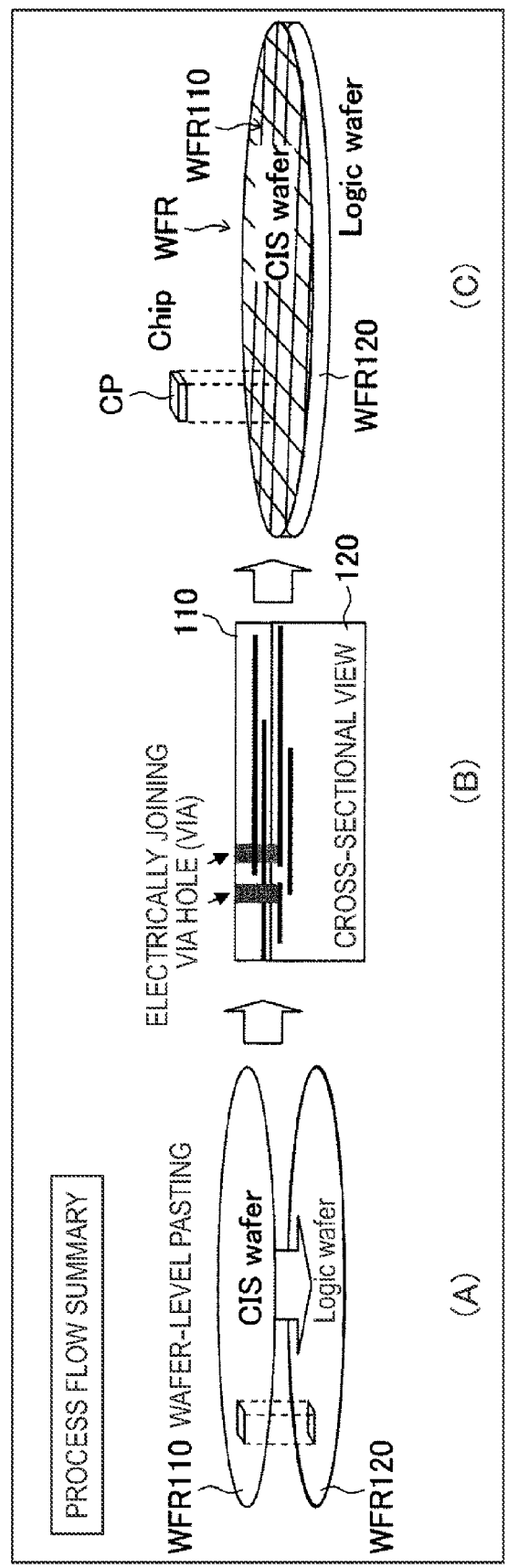
FIG. 6 is a diagram illustrating a process flow of the solid-state imaging device with the layered structure according to the embodiment.

Portions (A) to (C) of FIG. 6 illustrate a basic process flow of the solid-state imaging device with the layered structure according to the embodiment.

As illustrated in portion (A) of FIG. 6, after wafers WFR110 and WFR120 prepared with processes most suitable for the respective upper and lower chips are pasted together, the rear face of the upper chip is polished and the thickness of the wafer of the upper chip is made thinner.

After patterning on the first chip (upper chip) 110 side, through holes are bored from the first chip 110 side to a wiring layer of the second chip (lower chip) 120, and they are filled with metal to form via holes (VIA). In the embodiment, this VIA is referred to as TCV.

As illustrated in portion (B) of FIG. 6, this TCV electrically joins signal lines and power supply lines together between the upper and lower chips.

Then, as illustrated in portion (C) of FIG. 6, after performing processing to obtain color filters and microlenses on the first chip (upper chip) 110 side, chips are cut out by blade dicing after laser ablation.

Figure 7:
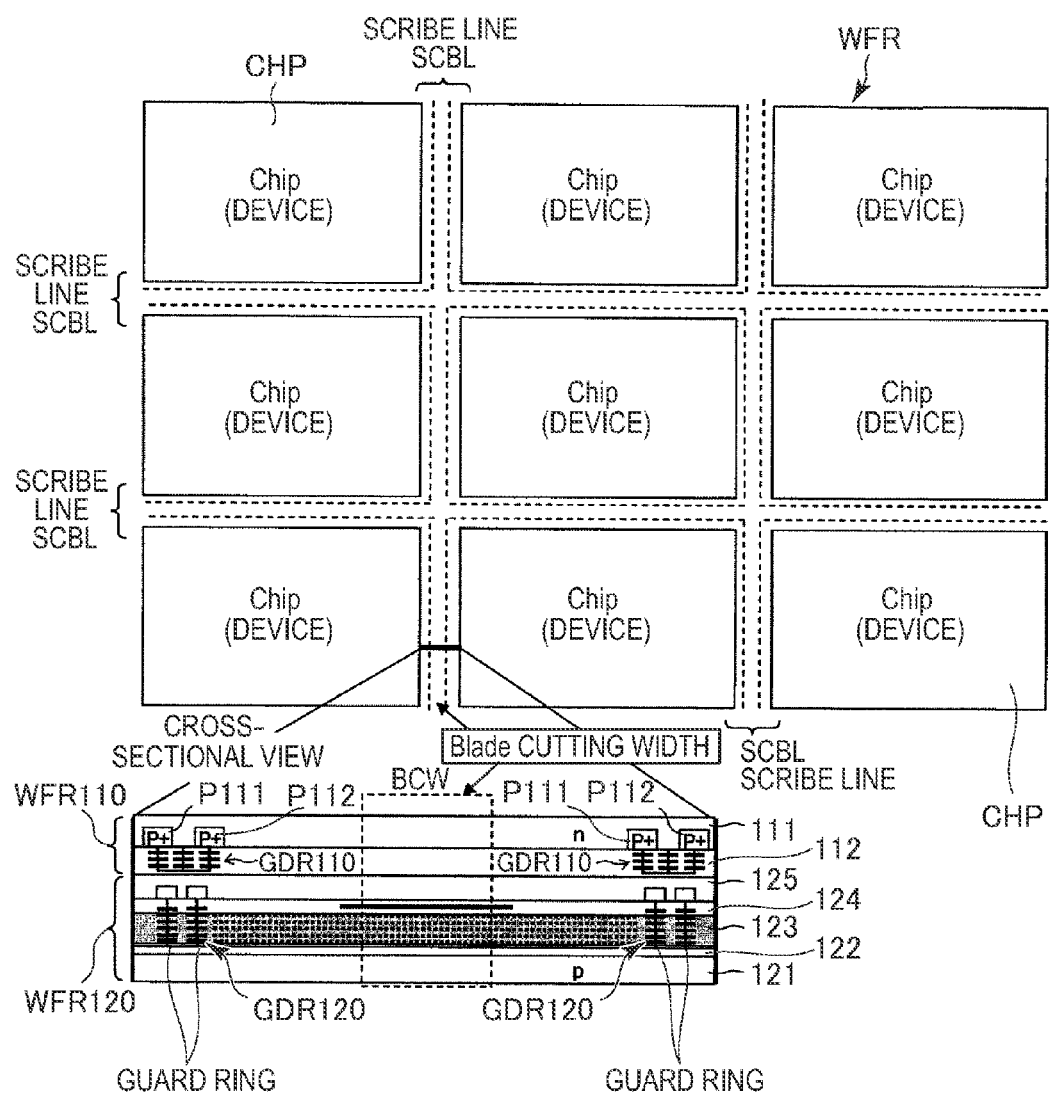
FIG. 7 is a diagram for explaining a manufacturing method and a basic configuration of the solid-state imaging device according to the embodiment which method is of cutting out chips by dicing.

FIG. 7 is a diagram for explaining a manufacturing method, of cutting out chips by dicing, and a basic configuration of the solid-state imaging device according to the embodiment.

Moreover, BCW in FIG. 7 denotes a cutting width with a blade.

The wafer with the layered structure in which chips CHP are arranged in an array shape is cut with a blade along scribe lines SCBL indicating positions for cutting between the chips, and is divided into the individual chips CHP.

In FIG. 7, a simplified cross section taken along a region including the scribe line SCBL which is the position for cutting is partially enlarged and illustrated.

In the layered structure in FIG. 7, a silicon (Si) layer (n-type substrate) 111 and a nitride film (for example, SiN film) 112 as an interlayer insulation film are layered to form the CIS-side wafer WFR110. In practice, sensors and the like are formed on the other face side opposite to the face of the Si layer 111 on which the SiN film is formed.

A silicon layer (p-type substrate) 121, an oxide film 122, a wiring (for example, copper Cu) layer 123, an $SiO_2$ layer 124 and an $SiO_2$ layer 125 are layered to form the logic-side wafer WFR120.

Furthermore, in the simplified structure in FIG. 7, the SiN film 112 of the CIS-side wafer WFR110 and the $SiO_2$ layer 125 of the logic-side wafer WFR120 are pasted together.

In addition, in the embodiment, first conductivity type corresponds to n-type and second conductivity type corresponds to p-type, whereas they may be reversed.

Furthermore, in the CIS-side wafer WFR110 and logic-side wafer WFR120, guard rings GDR110 and GDR120 are formed for preventing cracks from propagating to the chip side, and the like, in regions of the scribe lines SCBL which regions are near the chips.

The guard rings GDR110 and GDR120 are formed of conductive material, for example, wiring material such as Cu.

In the CIS-side wafer WFR110, the guard ring GDR110 is formed in the SiN film 112 so as to enclose the chip annularly.

A plurality of (three in the example of FIG. 7) guard ring parts GDR111, GDR112 and GDR113 with conductivity are formed at a predetermined interval in the direction perpendicular to the principal plane of the substrate, that is, the layering direction of the layered structure to form the guard ring GDR110.

These guard ring parts GDR111, GDR112 and GDR113 are electrically connected by a guard ring part GDR114 parallel to the principal plane of the substrate in the SiN film 112.

Furthermore, in the embodiment, the guard ring parts GDR111 and GDR112 arranged outermost of the guard ring GDR110 are connected to $p^+$ layers ($p^+$ diffusion layers) P111 and P112 formed in the n-type Si layer 111, respectively, at the interface between these guard ring parts GDR111 and GDR112 and the Si layer 111.

Figure 8:
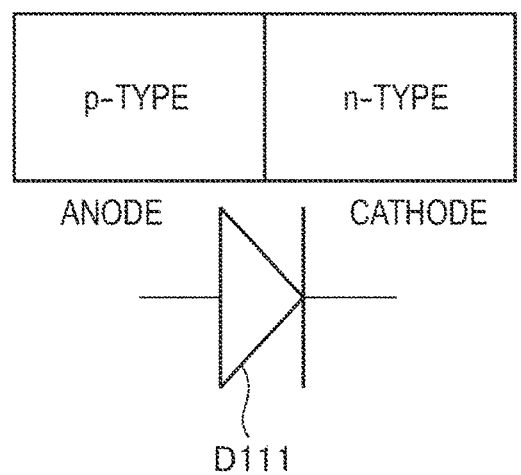
FIG. 8 is a diagram illustrating an equivalent circuit of a diode formed of pn junction.

Thus, a structure in which the inside and outside of the chip are electrically separated is formed due to a diode D111, as illustrated in FIG. 8, formed in principle by forming the $p^+$ layers P111 and P112 as second conductivity type layers in the n-type substrate (n-well) with first conductivity type.

Namely, in the embodiment, the structure is given in which separation between the n-well of the CIS-side wafer WFR110 and the $p^+$ layers P111 and P112 is attained and short status, even if any, does not affect the inside of the chip.

In addition, the $p^+$ layers ($p^+$ diffusion layers) P111 and P112 are formed by p-type ion implantation, for example, with diffusion layer formation of transistors which is performed parallelly.

Next, characteristic exemplary configurations of a guard ring region in the CIS-side wafer of the solid-state imaging device 100 according to the embodiment which region is for shutting a leak passage to prevent the influence of a short and the like are described.

<3. First Characteristic Exemplary Configuration of Solid-State Imaging Device>

Figure 9:
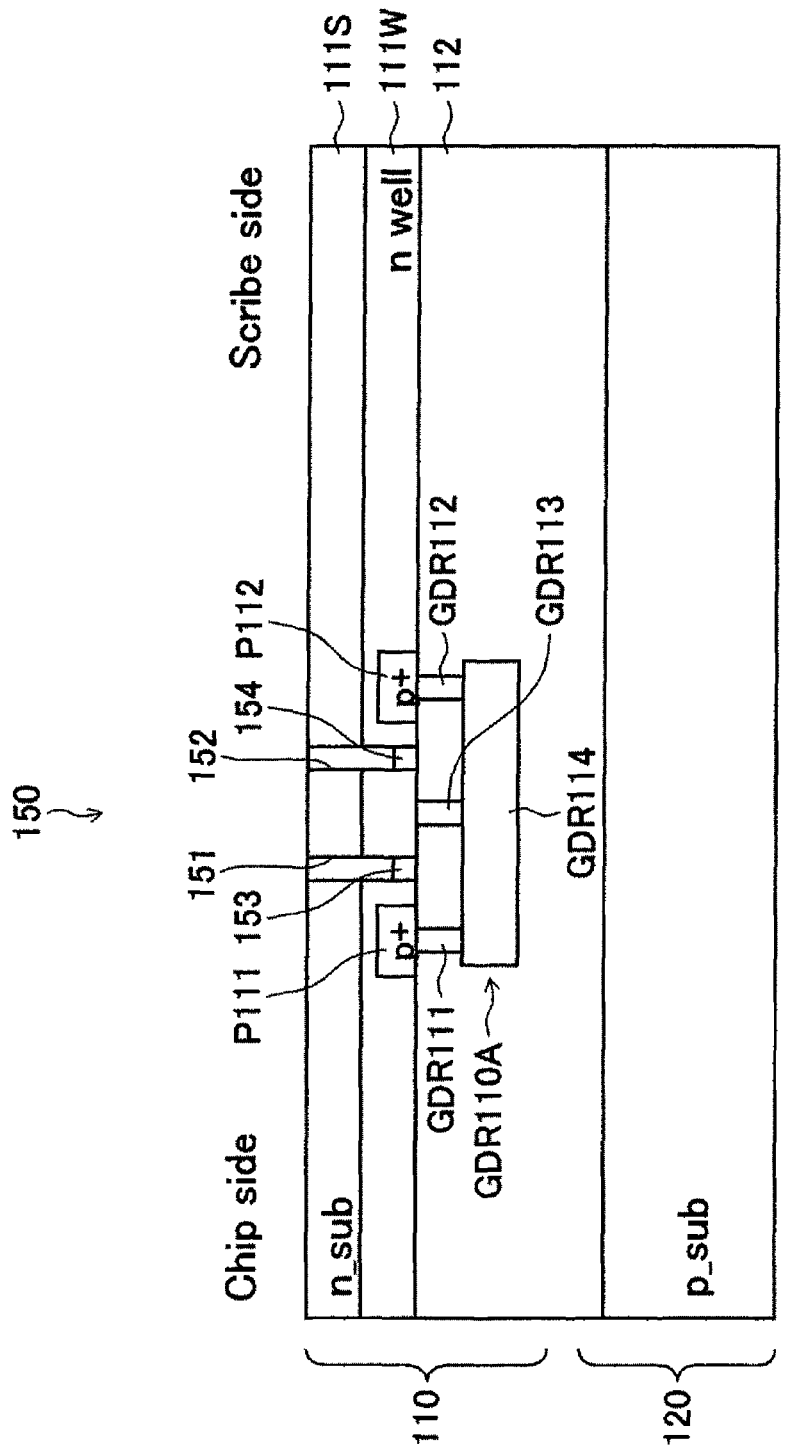
FIG. 9 is a diagram illustrating a first characteristic exemplary configuration of a guard ring region in a CIS-side wafer of the solid-state imaging device according to the embodiment.

FIG. 9 is a diagram illustrating a first characteristic exemplary configuration of a guard ring region in the CIS-side wafer of the solid-state imaging device according to the embodiment.

The configuration in FIG. 9 is basically same as the configuration described with reference to FIG. 7.

However, the Si layer 111 in FIG. 9 includes an n-type substrate part 111S and an n-well 111W.

To form a guard ring GDR110A in FIG. 9, a plurality of (three in the example of FIG. 9) guard ring parts GDR111, GDR112 and GDR113 with conductivity are formed at a predetermined interval in the direction perpendicular to the principal plane of the substrate, that is, the layering direction of the layered structure.

A first guard ring part GDR111 is formed on the chip side, a second guard ring part GDR112 is formed in the scribe line SCBL, and a third guard ring part GDR113 is formed between the guard ring parts GDR111 and GDR112.

These guard ring parts GDR111, GDR112 and GDR113 are electrically connected by a fourth guard ring part GDR114 parallel to the principal plane of the substrate in the SiN film 112.

Furthermore, in the embodiment, the guard ring parts GDR111 and GDR112 arranged outermost of the guard ring GDR110 are connected to $p^+$ layers ($p^+$ diffusion layers) P111 and P112 formed in the n-type Si layer 111, respectively, at the interface between these guard ring parts GDR111 and GDR112 and the Si layer 111.

Moreover, the guard ring part GDR113 in the center portion is connected directly to the n-type Si layer 111.

Furthermore, in the guard ring GDR110A in FIG. 9, an indication part 150 is formed which is formed of holes, and the like, reaching the vicinity of the boundary between the SiN film 112 and the Si film 111 from the outer face of the Si layer (n-type substrate) 111 of the CIS-side wafer WFR110.

The indication part 150 in the example of FIG. 9 has two slits (holes) 151 and 152, and insulation films 153 and 154 formed of SiN, for example, are disposed in the boundary portion between the slits (holes) 151 and 152 and the SiN film 112.

In the indication part 150, the slit 151 is formed such that its edge portion (insulation film) 153 locates between the guard ring parts GDR111 and GDR113 of the guard ring GDR110.

The slit 152 is formed such that its edge portion (insulation film) 154 locates between the guard ring parts GDR112 and GDR113 of the guard ring GDR110.

Thus, a structure in which the inside and outside of the chip are electrically separated is formed due to the diode D111, as illustrated in FIG. 8, formed in principle by forming the $p^+$layers P111 and P112 in the n-well 111W.

Namely, in the embodiment, the structure is given in which separation between the n-well of the CIS-side wafer WFR110 and the $p^+$ layers P111 and P112 is attained and short status, even if any, does not affect the inside of the chip.

<4. Second Characteristic Exemplary Configuration of Solid-State Imaging Device>

Figure 10:
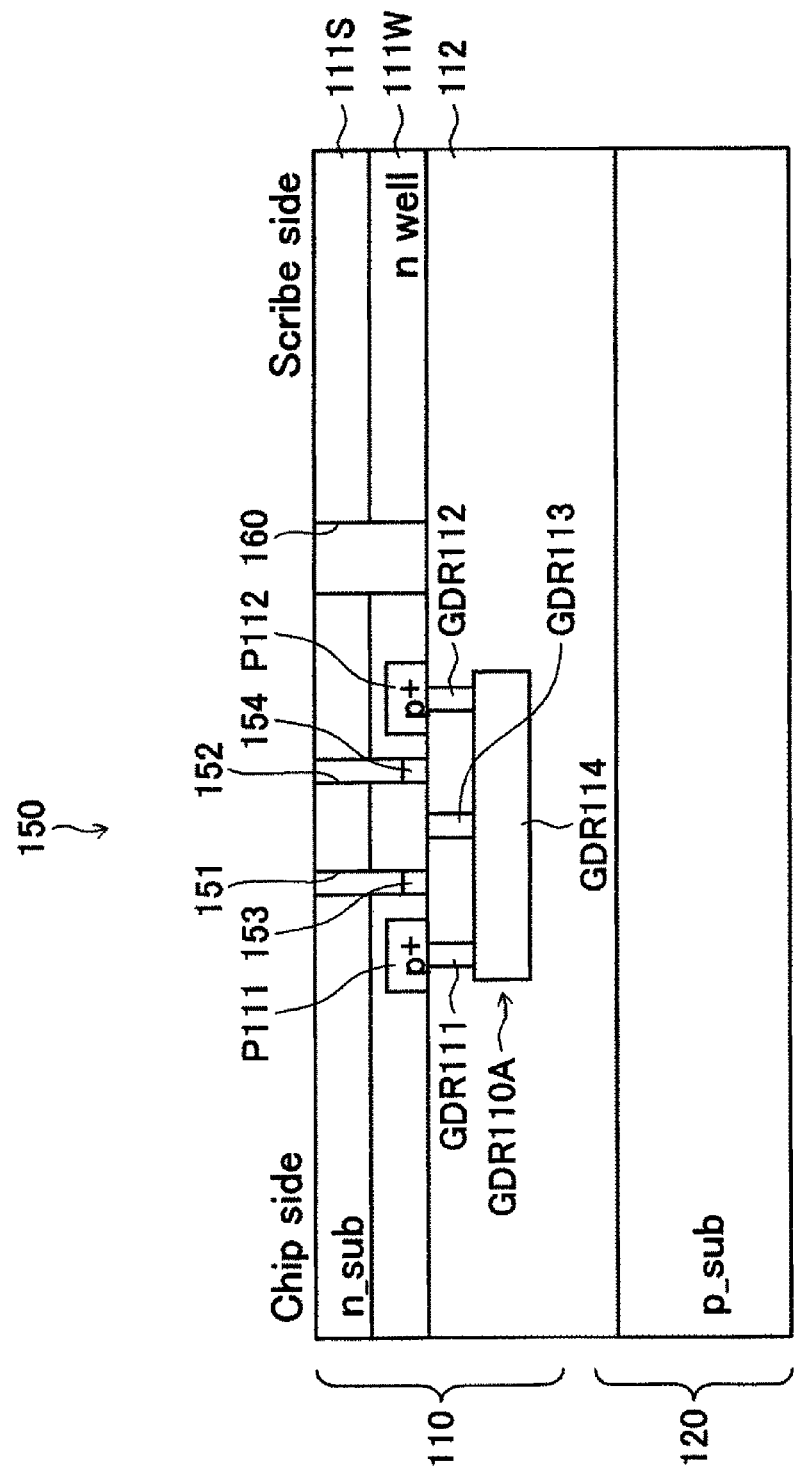
FIG. 10 is a diagram illustrating a second characteristic exemplary configuration of the guard ring region in the CIS-side wafer of the solid-state imaging device according to the embodiment.

FIG. 10 is a diagram illustrating a second characteristic exemplary configuration of the guard ring region in the CIS-side wafer of the solid-state imaging device according to the embodiment.

Difference of the configuration in FIG. 10 from the configuration in FIG. 9 is as follows.

In the configuration in FIG. 10, a slit 160 is formed, which reaches the boundary portion facing the SiN film 112 from the outer face, in the n-type substrate 111S and n-well 111W on the scribe line SCBL side relative to the guard ring GDR110A.

Providing this slit 160 enables to shut a leak passage, and moreover, to release stress exerted in dicing to prevent occurrence of cracks.

<5. Third Characteristic Exemplary Configuration of Solid-State Imaging Device>

Figure 11:
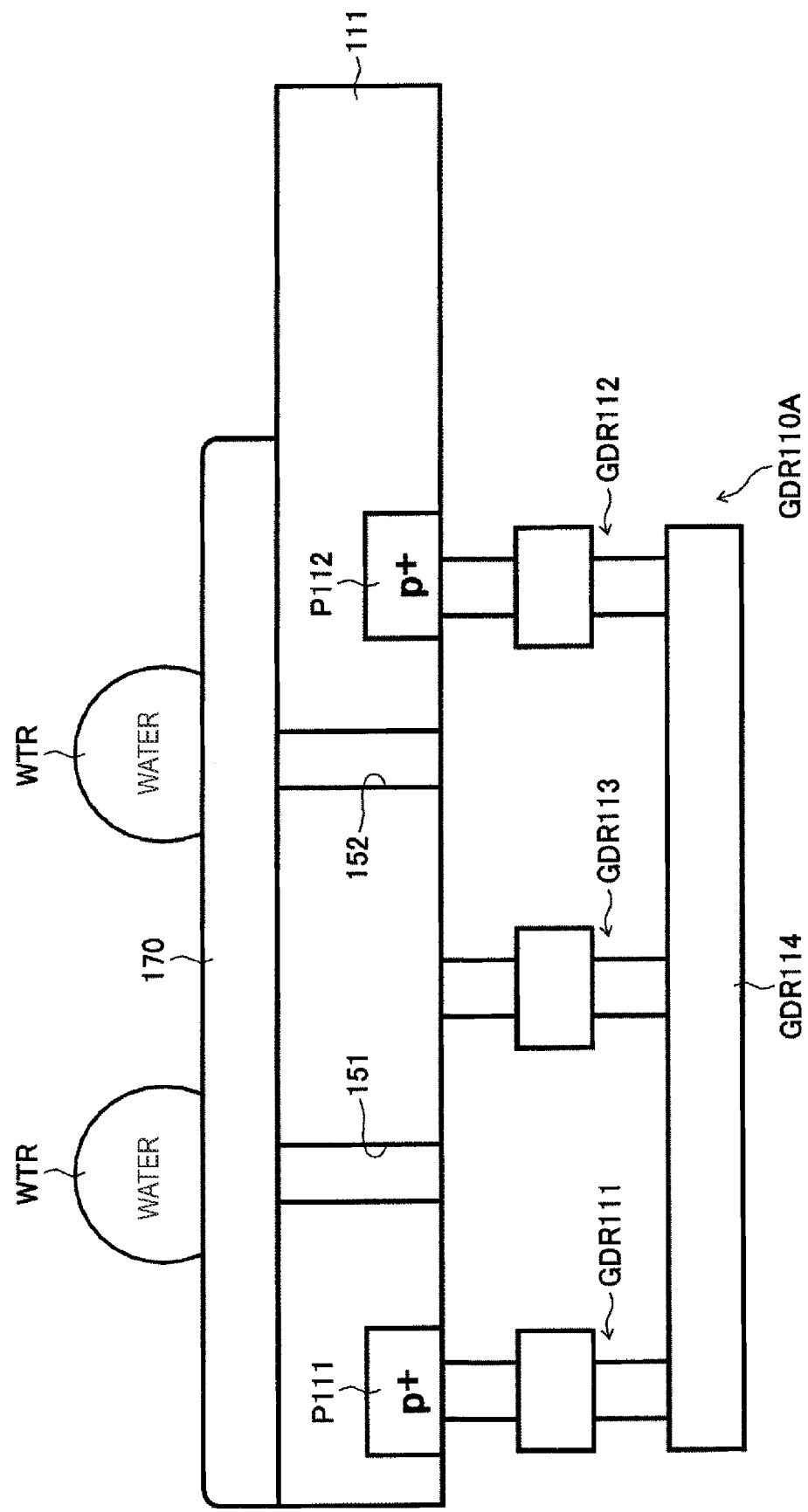
FIG. 11 is a diagram illustrating a third characteristic exemplary configuration of the guard ring region in the CIS-side wafer of the solid-state imaging device according to the embodiment.

FIG. 11 is a diagram illustrating a third characteristic exemplary configuration of the guard ring region in the CIS-side wafer of the solid-state imaging device according to the embodiment.

Figure 12:
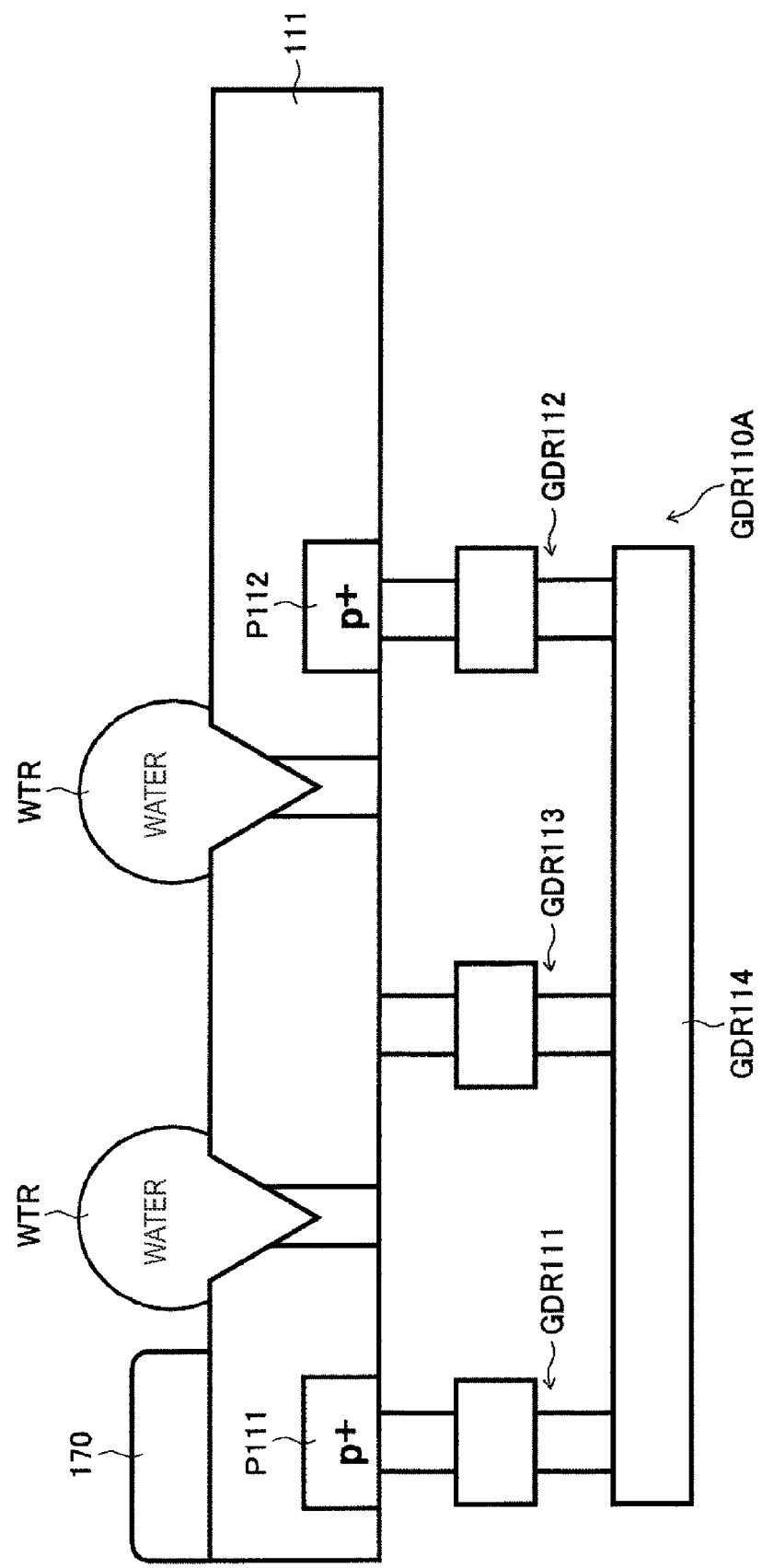
FIG. 12 is a diagram for explaining a risk of a short circuit (short) in case of internal condensation in the configuration in FIG. 9.

FIG. 12 is a diagram for explaining a risk of a short circuit (short) in case of internal condensation in the configuration in FIG. 9.

In addition, FIG. 11 and FIG. 12 illustrate lens stages 170 formed on the Si layer (n-type substrate) 111.

Difference of the configuration in FIG. 11 from the configuration in FIG. 9 is as follows.

In the case of the configuration in FIG. 9, there is a risk of a short circuit (short) of bypassing the separation structure of the $p^+$ layers P111 and P112 when moisture WTR permeates the slits (holes) 151 and 152 on the occasion of internal condensation in module status as illustrated in FIG. 12.

Then, in the configuration in FIG. 11, although the lens stage 170 is formed up to the position approximately corresponding to the chip-side guard ring part GDR111 of the guard ring GDR110A typically, it is extended to the position corresponding to the guard ring part GDR112 on the scribe line SCBL side.

Namely, FIG. 11 illustrates the configuration in which moisture is prevented from permeating the slits 151 and 152 of the indication part 150 due to the lens stage 170 formed of insulation material such as acrylics.

Hence, even in case of internal condensation in module status, moisture WTR is prevented from permeating the slits (holes) 151 and 152, and thereby, a short circuit (short) can be suppressed from arising from bypassing the separation structure of the $p^+$ layers P111 and P112.

<6. Fourth Characteristic Exemplary Configuration of Solid-State Imaging Device>

Figure 13:
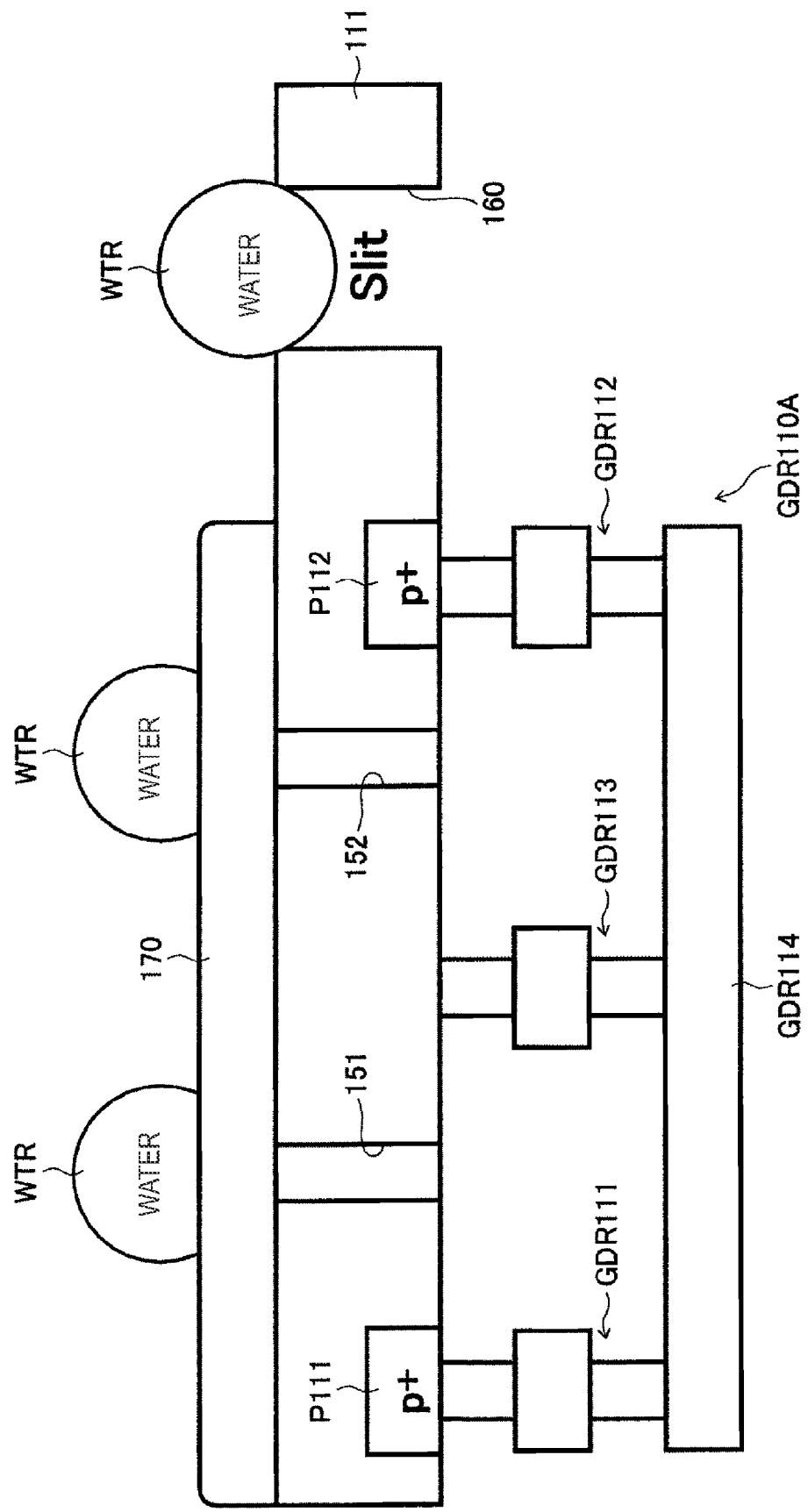
FIG. 13 is a diagram illustrating a fourth characteristic exemplary configuration of the guard ring region in the CIS-side wafer of the solid-state imaging device according to the embodiment.

FIG. 13 is a diagram illustrating a fourth characteristic exemplary configuration of the guard ring region in the CIS-side wafer of the solid-state imaging device according to the embodiment.

Figure 14:
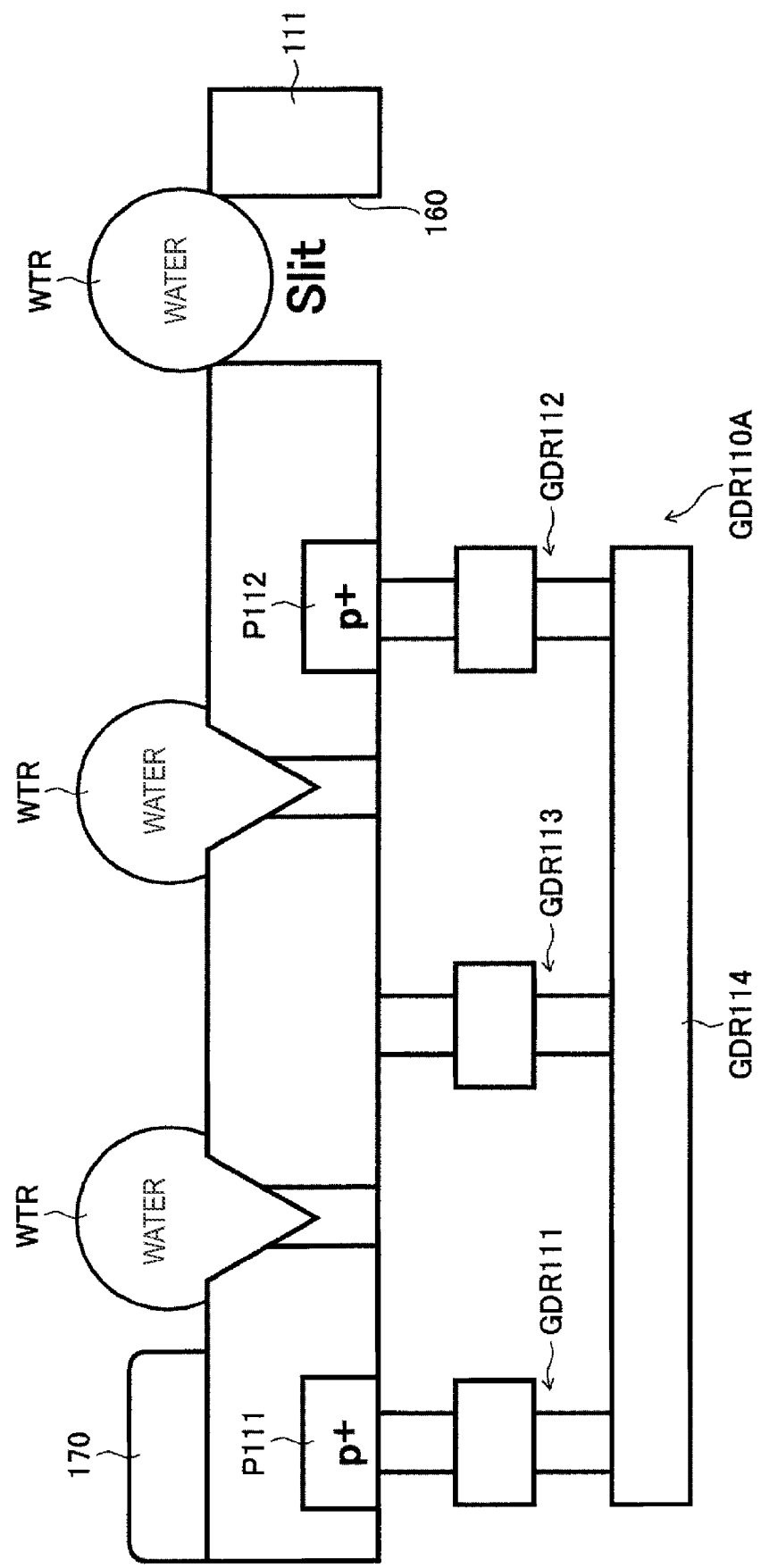
FIG. 14 is a diagram for explaining a risk of a short circuit (short) in case of internal condensation in the configuration in FIG. 10.

FIG. 14 is a diagram for explaining a risk of a short circuit (short) in case of internal condensation in the configuration in FIG. 10.

In addition, FIG. 13 and FIG. 14 illustrate lens stages 170 formed on the Si layer (n-type substrate) 111.

Difference of the configuration in FIG. 13 from the configuration in FIG. 10 is as follows.

In the case of the configuration in FIG. 10, there is a risk of a short circuit (short) of bypassing the separation structure of the $p^+$ layers P111 and P112 when moisture WTR permeates the slits (holes) 151 and 152 on the occasion of internal condensation in module status as illustrated in FIG. 14.

Then, in the configuration in FIG. 13, although the lens stage 170 is formed up to the position approximately corresponding to the chip-side guard ring part GDR111 of the guard ring GDR110A typically, it is extended to the position corresponding to the guard ring part GDR112 on the scribe line SCBL side.

Namely, FIG. 13 illustrates the configuration in which moisture is prevented from permeating the slits 151 and 152 of the indication part 150 due to the lens stage 170 formed of insulation material such as acrylics.

Hence, even in case of internal condensation in module status, moisture WTR is prevented from permeating the slits (holes) 151 and 152, and thereby, a short circuit (short) can be suppressed from arising from bypassing the separation structure of the $p^+$ layers P111 and P112.

However, in the configuration in FIG. 13, although there is a risk of moisture WTR permeating the slit 160 on the scribe line SCBL side as illustrated in FIG. 14, there is less influence of the risk because the separation structure is established at the guard ring GDR110A.

Providing this slit 160 enables to release stress exerted in dicing to prevent occurrence of cracks, this being quite a significant advantage.

As above, the first guard ring part GDR111 and second guard ring part GDR112 arranged outermost of the guard ring GDR110 are connected to the $p^+$ layers ($p^+$ diffusion layers) P111 and P112 formed in the n-type Si layer 111, respectively, at the interface between these first guard ring part GDR111 and second guard ring part GDR112 and the Si layer 111.

Thus, the diode D111 is formed by forming the $p^+$ layers P111 and P112 as second conductivity type layers in the n-type substrate (n-well) with first conductivity type.

Figure 15:
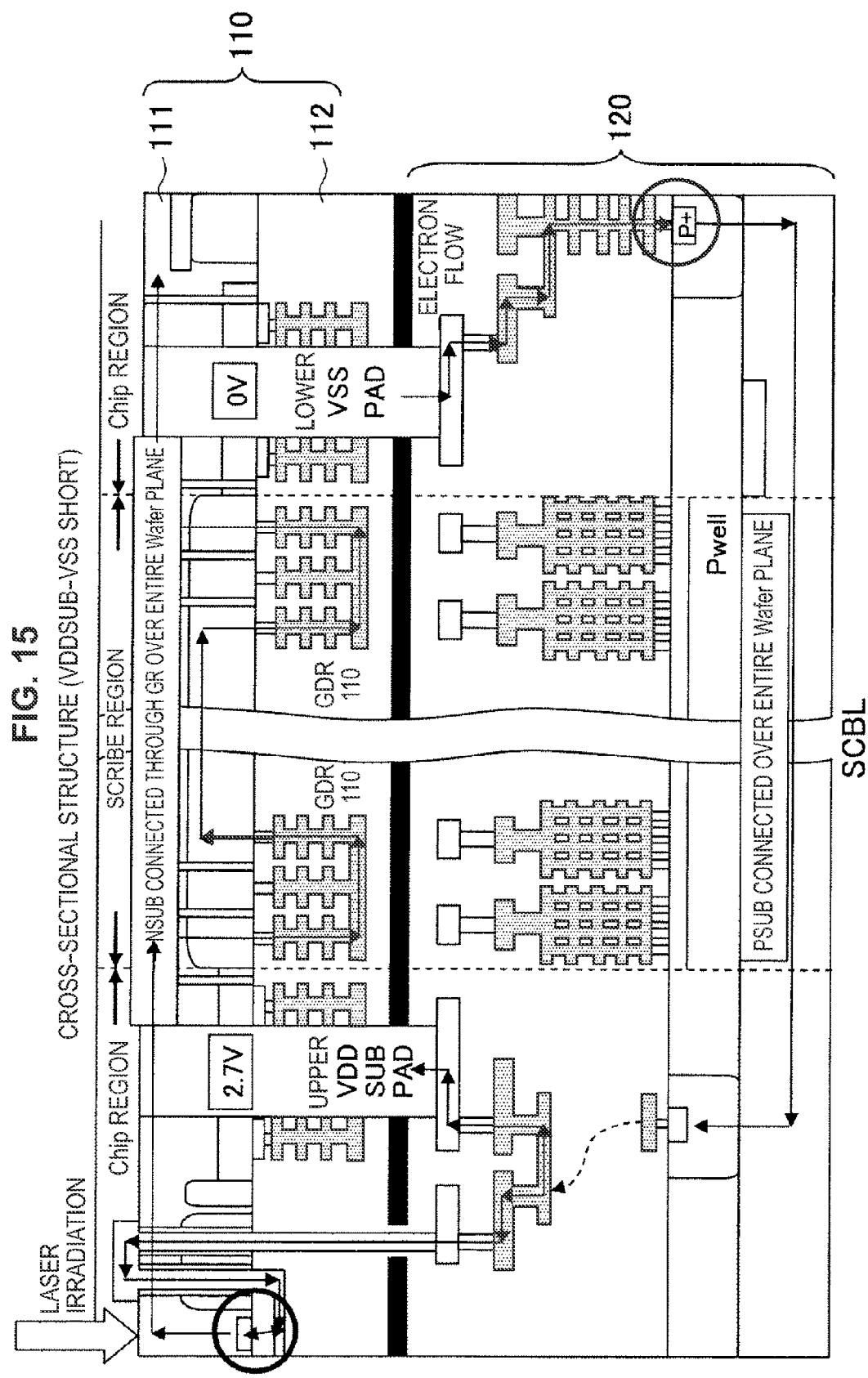
FIG. 15 is a diagram illustrating formation of a leak current passage caused by malformation of a TCV portion.
Figure 16:
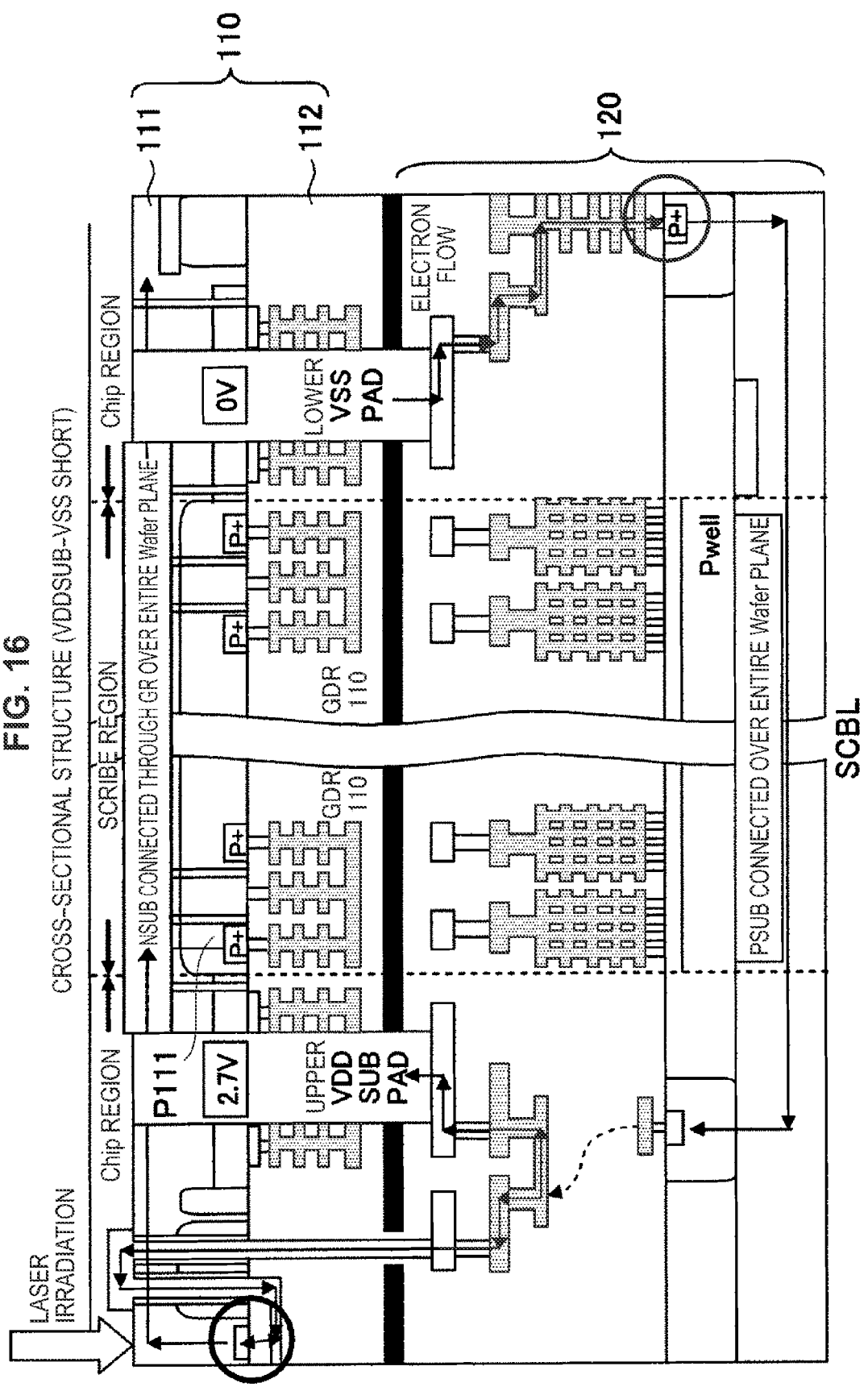
FIG. 16 is a diagram illustrating capability of shutting the leak current passage due to the configuration according to the embodiment even in case of the malformation of the TCV portion.

Thereby, the structure can be formed in which a current passage between the inside and outside of the chip is electrically separated as illustrated in FIG. 16, although a leak current passage as illustrated in FIG. 15 has been formed caused by malformation of the TCV portion, for example.

As a result, the influence of the leak between the two substrates which are layered can be prevented, and therefore, the influence on measurement before shipping can be suppressed.

<7. Summary of Solid-State Imaging Device>

An exemplary configuration of a CMOS image sensor is described as one example of the solid-state imaging device according to the embodiment.

Figure 17:
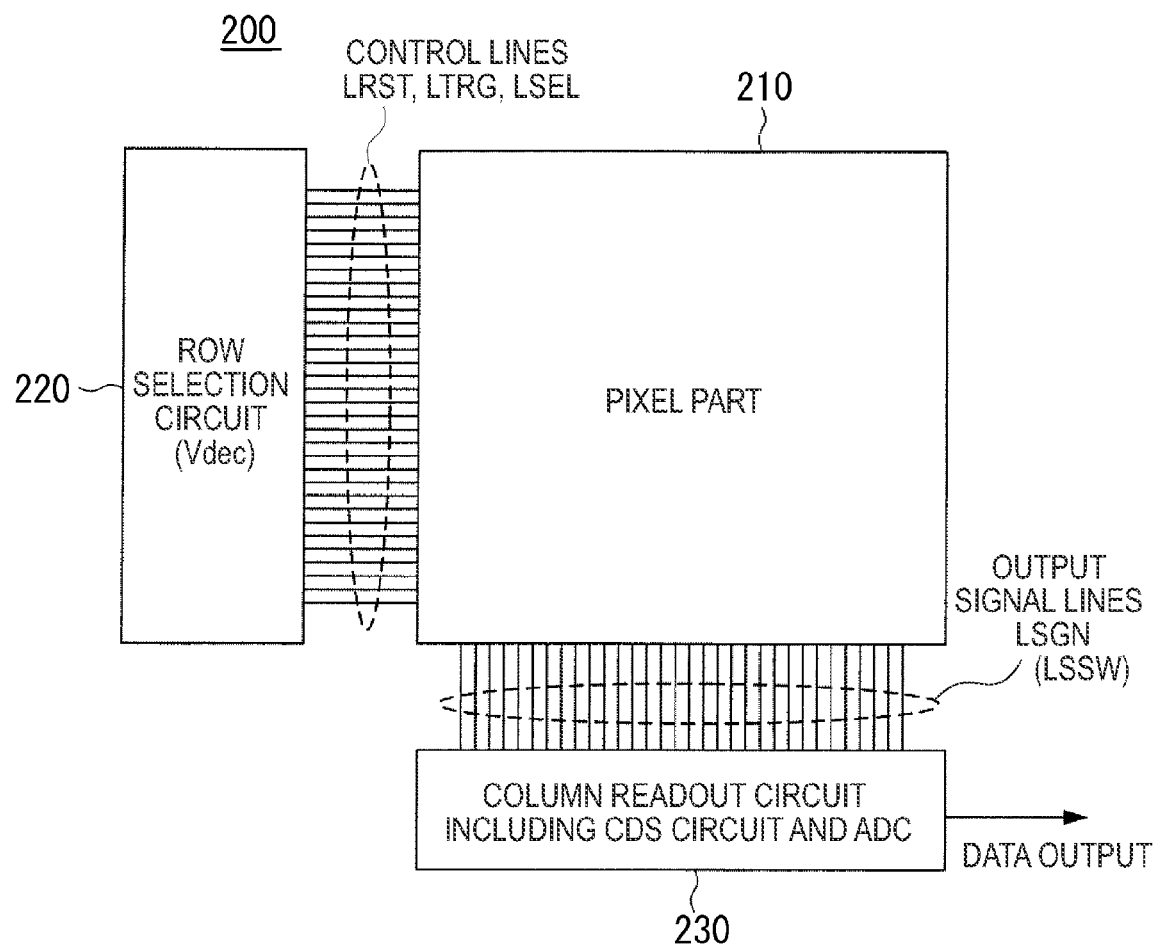
FIG. 17 is a diagram illustrating a basic exemplary configuration of a CMOS image sensor (solid-state imaging device) according to the embodiment.

FIG. 17 is a diagram illustrating a basic exemplary configuration of a CMOS image sensor (solid-state imaging device) according to the embodiment.

A CMOS image sensor 200 in FIG. 17 includes a pixel part 210, a row selection circuit (Vdec) 220 and a column readout circuit (AFE) 230.

Furthermore, a pixel signal readout part is formed of the row selection circuit 220 and column readout circuit 230.

This CMOS image sensor 200 as a semiconductor device employs the layered structure in FIG. 4.

In the embodiment, in this layered structure, the pixel part 210 is disposed in the first chip 110 basically. Furthermore, for example, the row selection circuit 220 and column readout circuit 230 which constitute the pixel signal readout part are disposed in the second chip 120.

Then, drive signals for pixels, analog readout signals of the pixels (sensors), power supply voltage, and the like are transmitted and received between the first chip 110 and second chip 120 through the TCV formed in the first chip 110.

The pixel part 210 is formed by arranging a plurality of pixel circuits 210A in a two-dimensional shape of M rows x N columns (matrix shape).

Figure 18:
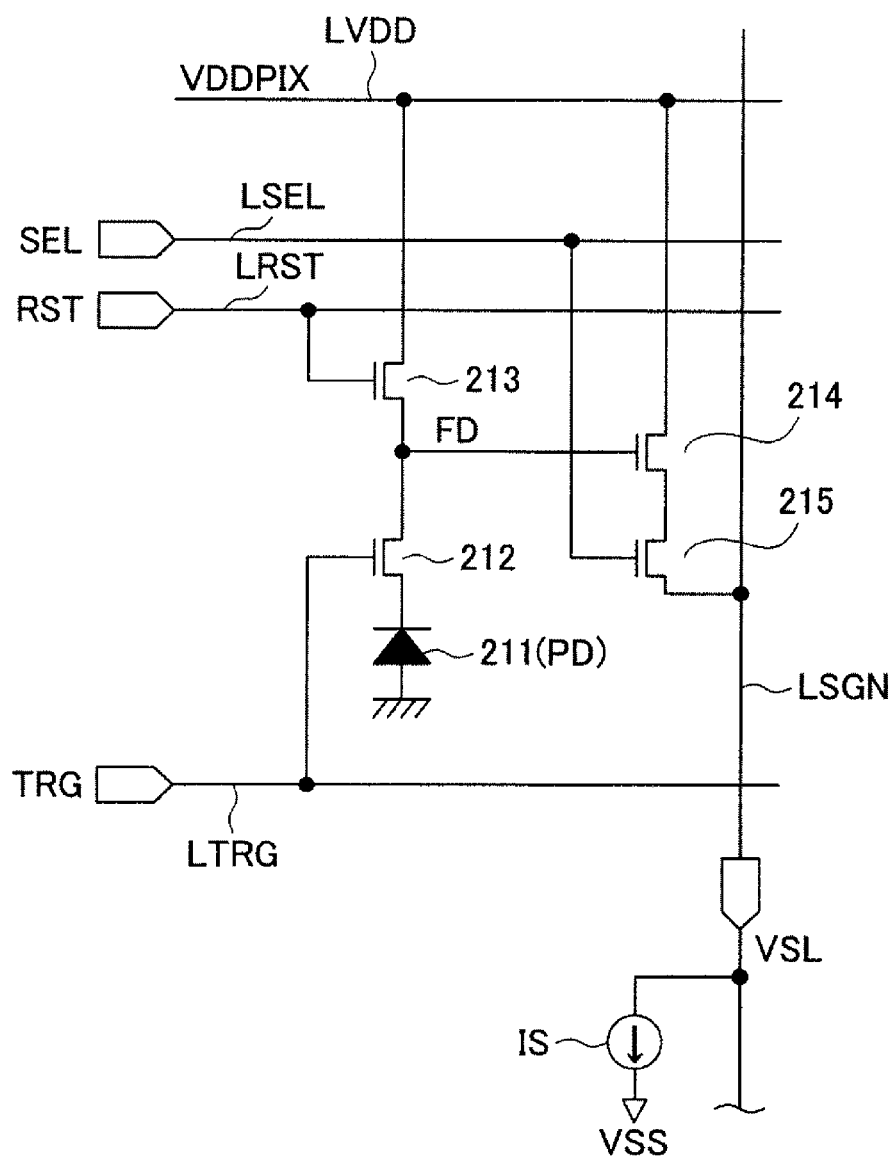
FIG. 18 is a diagram illustrating one example of a pixel of the CMOS image sensor constituted of four transistors according to the embodiment.

FIG. 18 is a diagram illustrating one example of a pixel of the CMOS image sensor constituted of four transistors according to the embodiment.

This pixel circuit 210A includes a photoelectric transducer (hereinafter, sometimes referred to simply as PD) 211 constituted of a photodiode (PD), for example.

Furthermore, the pixel circuit 210A includes four transistors of a transfer transistor 212, a reset transistor 213, an amplification transistor 214 and a selection transistor 215 as active elements with respect to this one photoelectric transducer 211.

The photoelectric transducer 211 performs photoelectric conversion on incident light into charge with an amount (herein, electrons) according to the amount of the light.

The transfer transistor 212 as a transfer element is connected between the photoelectric transducer 211 and a floating diffusion FD as an input node, and to its gate (transfer gate), a transfer signal TRG as a control signal is given via a transfer control line LTRG.

Thereby, the transfer transistor 212 transfers the electrons obtained by the photoelectric conversion with the photoelectric transducer 211 to the floating diffusion FD.

The reset transistor 213 is connected between a power supply line LVDD through which a power supply voltage VDD is supplied and the floating diffusion FD, and to its gate, a reset signal RST as a control signal is given via a reset control line LRST.

Thereby, the reset transistor 213 as a reset element resets a potential of the floating diffusion FD to the potential of the power supply line LVDD.

The gate of the amplification transistor 214 as an amplification element is connected to the floating diffusion FD. Namely, the floating diffusion FD functions as the input node of the amplification transistor 214 as an amplification element.

The amplification transistor 214 and selection transistor 215 are connected in series between the power supply line LVDD through which the power supply voltage VDD is supplied and a signal line LSGN.

Thus, the amplification transistor 214 is connected to the signal line LSGN via the selection transistor 215, and constitutes a source follower in association with a constant current source IS outside the pixel part.

And a selection signal SEL which is a control signal corresponding to an address signal is given to the gate of the selection transistor 215 via the selection control line LSEL, and the selection transistor 215 is turned on.

Upon turning on the selection transistor 215, the amplification transistor 214 amplifies the potential of the floating diffusion FD to output a voltage corresponding to the potential to the signal line LSGN. The voltage outputted from each pixel via the signal line LSGN is outputted to the column readout circuit 230.

These operations are performed simultaneously for individual pixels in one row since individual gates, for example, of the transfer transistors 212, reset transistors 213 and selection transistors 215 are connected in row unit.

The reset control line LRST, transfer control line LTRG and selection control line LSEL, which are wired to the pixel part 210, are as one set which undergoes wiring in each row unit of the pixel arrangement.

The control lines of each of LRST, LTRG and LSEL provided are M lines for each.

These reset control lines LRST, transfer control lines LTRG and selection control lines LSEL are driven by the row selection circuit 220.

The row selection circuit 220 controls operations of pixels arranged in an arbitrary row of the pixel part 210. The row selection circuit 220 controls pixels via the control lines LSEL, LRST and LTRG.

The row selection circuit 220 performs image driving control, for example, switching an exposure method between a rolling shutter method of performing exposure for each row and a global shutter method of performing exposure simultaneously for all the pixels according to a shutter mode switching signal The column readout circuit 230 receives data of the pixel row having undergone readout control performed by the row selection circuit 220 via the signal output line LSGN, and transfer it to the downstream signal processing circuits.

The column readout circuit 230 includes a CDS circuit, an ADC (analog digital converter) and the like.

In addition, the CMOS image sensor according to the embodiment is not necessarily limited to but can be a CMOS image sensor mounting a column-parallel analog-digital converter (hereinafter, abbreviated as ADC), for example.

In addition, in the embodiment, the configuration of the CMOS image sensor is described as one example of the semiconductor device, whereas the above-mentioned configuration can be applied, for example, to a back-illuminated CMOS image sensor and can realize the above-mentioned individual effects. However, even in case of a front-illuminated one, the above-mentioned effects can be efficiently realized.

The solid-state imaging device having such a configuration can be applied as an imaging device for digital cameras, video cameras and the like.

Figure 19:
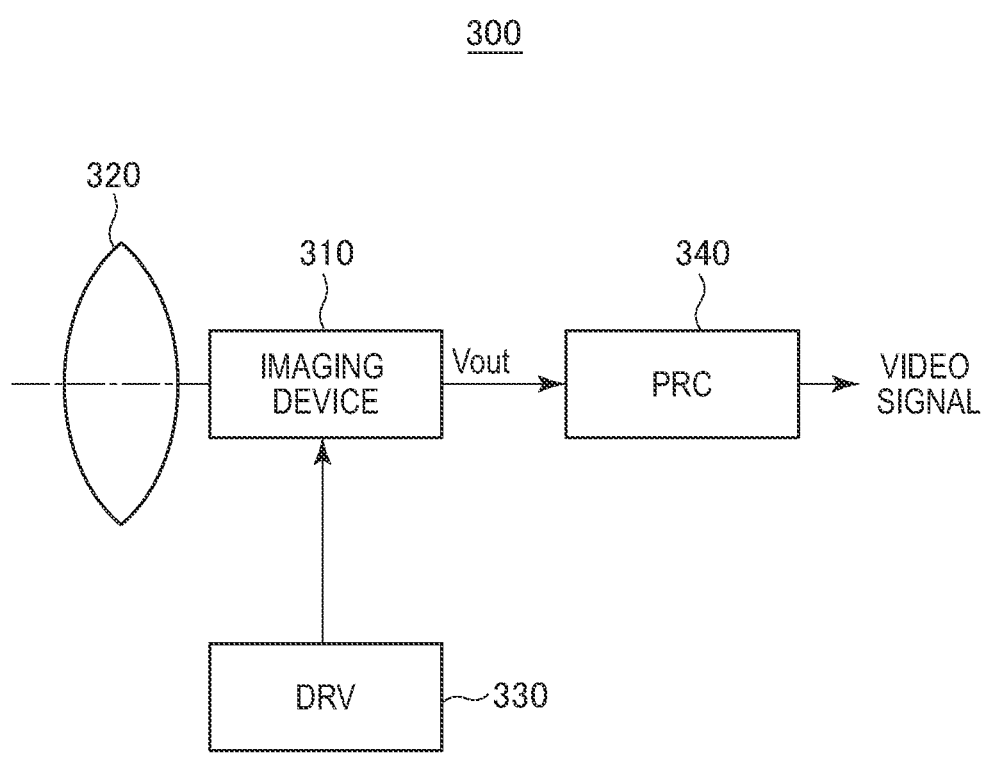
FIG. 19 is a diagram illustrating one example of a configuration of a camera system to which the solid-state imaging device according to the embodiment is applied.

FIG. 19 is a diagram illustrating one example of a configuration of a camera system to which the solid-state imaging device according to the embodiment of the present technology is applied.

As illustrated in FIG. 19, the camera system 300 includes an imaging device 310 to which the CMOS image sensors (solid-state imaging device) 100 and 200 according to the embodiment can be applied.

Furthermore, the camera system 300 includes an optical system guiding incident light to the pixel region of this imaging device 310 (imaging a subject image), for example, a lens 320 imaging incident light (image light) on an imaging plane.

The camera system 300 includes a driving circuit (DRV) 330 driving the imaging device 310, and a signal processing circuit (PRC) 340 processing output signals from the imaging device 310.

The driving circuit 330 includes a timing generator (not shown) generating various timing signals including a start pulse, a clock pulse and the like for driving circuits in the imaging device 310, and drives the imaging device 310 with predetermined timing signals.

Moreover, the signal processing circuits 340 performs predetermined signal processing on the output signals from the imaging device 310.

The image signal processed by the signal processing circuit 340 is recorded in a recording medium such, for example, as a memory. The image information recorded in the recording medium undergoes hard-copy with a printer or the like. Moreover, the image signal processed by the signal processing circuit 340 is displayed as a moving image on a monitor constituted of a liquid crystal display and the like.

As described above, any of the previously mentioned solid-state imaging devices 100 and 200 is mounted as the imaging device 310 in an image capturing device such as a digital still camera, and thereby, a camera high in accuracy and reliability can be realized.

It should be understood by those skilled in the art that various modifications, combinations, sub-combinations and alterations may occur depending on design requirements and other factors insofar as they are within the scope of the appended claims or the equivalents thereof Additionally, the present technology may also be configured as below.

(1) A solid-state imaging device including
  a wafer including
    first chips each having a pixel part in which a plurality of pixels performing photoelectric conversion are arranged and which is formed in a first conductivity type substrate,
    second chips each having a logic part, in which a pixel signal readout part reading out a pixel signal from the pixel part is formed in a second conductivity type substrate, and
    layered chips each having a layered structure in which the first chip and the second chip are pasted together, the layered chips being arranged in an array shape,
  wherein, in the wafer,
  a wiring between the first chip and the second chip is connected through a via hole formed in the first chip,
  a scribe line region for cutting is provided between the layered chips,
  a guard ring with conductivity in an insulation film layered on the first conductivity type substrate is formed between an edge portion of at least the first chip, out of the first chip and the second chip of the layered chip, and the scribe line region,
  at least two second conductivity type layers are formed at an interval within a region corresponding to the guard ring, in the first conductivity type substrate, and the guard ring includes
  a first guard ring part connected to one of the second conductivity type layers on a chip edge portion side, and
  a second guard ring part connected to another one of the second conductivity type layers on a scribe line side.
(2) The solid-state imaging device according to (1),
  wherein an indication part including a hole reaching a boundary portion of the insulation film from an outer face side of the first conductivity type substrate is formed in a region corresponding to the guard ring of the first conductivity type substrate.
(3) The solid-state imaging device according to (2),
  wherein an insulation material is formed at least from the chip side up to a region including the indication part on the outer face side of the first conductivity type substrate.
(4) The solid-state imaging device according to (3),
  wherein the insulation material is formed by extending a lens stage with insulation formed on the chip side to the region including the indication part.
(5) The solid-state imaging device according to any one of (1) to (4),
  wherein a slit is formed reaching a boundary portion with the insulation film from an outer face in the first conductivity type substrate on the scribe line side relative to the guard ring.
(6) A solid-state imaging device including:
  a first chip having a pixel part in which a plurality of pixels performing photoelectric conversion are arranged and which is formed in a first conductivity type substrate;
  a second chip having a logic part, in which a pixel signal readout part reading out a pixel signal from the pixel part is formed in a second conductivity type substrate; and
  a layered chip having a layered structure in which the first chip and the second chip are pasted together,
  wherein a wiring between the first chip and the second chip is connected through a via hole formed in the first chip,
  wherein a guard ring with conductivity in an insulation film layered on the first conductivity type substrate is formed between an edge portion of at least the first chip, out of the first chip and the second chip of the layered chip, and a cutting edge portion of the chip,
  wherein at least two second conductivity type layers are formed at an interval within a region corresponding to the guard ring, in the first conductivity type substrate, and
    wherein the guard ring includes
      a first guard ring part connected to one of the second conductivity type layers on a chip edge portion side, and
      a second guard ring part connected to another one of the second conductivity type layers on a cutting edge portion side.
(7) The solid-state imaging device according to (6),
  wherein an indication part including a hole reaching a boundary portion of the insulation film from an outer face side of the first conductivity type substrate is formed in a region corresponding to the guard ring of the first conductivity type substrate.
(8) The solid-state imaging device according to (7),
  wherein an insulation material is formed at least from the chip side up to a region including the indication part on the outer face side of the first conductivity type substrate.
(9) The solid-state imaging device according to (8),
  wherein the insulation material is formed by extending a lens stage with insulation formed on the chip side to the region including the indication part.
(10) The solid-state imaging device according to any one of (6) to (9),
  wherein a slit is formed reaching a boundary portion with the insulation film from an outer face in the first conductivity type substrate on the cutting edge portion side relative to the guard ring.
(11) A camera system including:
  a solid-state imaging device; and
  an optical system imaging a subject image in the solid-state imaging device,
  wherein the solid-state imaging device includes
    a first chip having a pixel part in which a plurality of pixels performing photoelectric conversion are arranged and which is formed in a first conductivity type substrate,
    a second chip having a logic part, in which a pixel signal readout part reading out a pixel signal from the pixel part is formed in a second conductivity type substrate, and
    a layered chip having a layered structure in which the first chip and the second chip are pasted together,
  wherein a wiring between the first chip and the second chip is connected through a via hole formed in the first chip,
  wherein a guard ring with conductivity in an insulation film layered on the first conductivity type substrate is formed between an edge portion of at least the first chip, out of the first chip and the second chip of the layered chip, and a cutting edge portion of the chip,
  wherein at least two second conductivity type layers are formed at an interval within a region corresponding to the guard ring, in the first conductivity type substrate, and
    wherein the guard ring includes
      a first guard ring part connected to one of the second conductivity type layers on a chip edge portion side, and
      a second guard ring part connected to another one of the second conductivity type layers on a cutting edge portion side.

The present application is a continuation of U.S. patent application Ser. No. 13/764,448 filed on Feb. 11, 2013 which claims priority of the Japanese Patent Appl. No. 2012-059247 filed in the Japan Patent Office on Mar. 15, 2012, the entire content of which is incorporated herein by reference.

The invention claimed is:
1. A solid-state imaging device comprising:
  a wafer including:
    a first chip having a pixel part in which a plurality of pixels performing photoelectric conversion are arranged;
    a second chip having a signal processing part, in which a pixel signal readout part reading out a pixel signal from the pixel part is arranged; and
    wherein, in the wafer,
    the first chip and the second chip are pasted together,
    wirings in the first chip and the second chip are connected through a via hole formed in the first chip,
    a scribe line region for cutting is provided in the pasted chip,
    a guard ring in an insulation film layer of the first chip is formed in the predetermined region adjacent to the scribe line region, wherein the guard ring comprises a plurality of guard ring parts,
    a first slit and a second slit are disposed in the first chip, and wherein,
    a first guard ring part, a second guard ring part and a third guard ring part are connected in the insulation film layer, the first slit is disposed between the first guard ring part and the second guard ring part, the second slit is disposed between the second guard ring part and third guard ring part, and wherein a third slit is formed on a side of the scribe line region relative to the guard ring.

2. The solid-state imaging device according to claim 1, wherein an insulation material is formed in at least one of the slits.

3. The solid-state imaging device according to claim 2, wherein the insulation material is formed below a lens stage.

4. A camera system comprising:
a solid-state imaging device; and
an optical system imaging a subject image in the solid-state imaging device, wherein the solid-state imaging device includes:
a wafer including:
  a first chip having a pixel part in which a plurality of pixels performing photoelectric conversion are arranged;
  a second chip having a signal processing part, in which a pixel signal readout part reading out a pixel signal from the pixel part is arranged; and
wherein, in the wafer,
  the first chip and the second chip are pasted together, wirings in the first chip and the second chip are connected through a via hole formed in the first chip,
  a scribe line region for cutting is provided in the pasted chip,
  a guard ring in an insulation film layer of the first chip is formed in the predetermined region adjacent to the scribe line region, wherein the guard ring comprises a plurality of guard ring parts,
  a first slit and a second slit are disposed in the first chip, and
wherein,
  a first guard ring part, a second guard ring part and a third guard ring part are connected in the insulation film layer,
  the first slit is disposed between the first guard ring part and the second guard ring part, the second slit is disposed between the second guard ring part and the third guard ring part, and
  wherein a third slit is formed on a side of the scribe line region relative to the guard ring.

5. The solid-state imaging device according to claim 1, wherein the first guard ring part, the second guard ring part, and the third guard ring part are electrically connected by a fourth guard ring part.

6. The solid-state imaging device according to claim 5, wherein the fourth guard ring part is disposed, in the insulation film layer, parallel to a principal plane of the first chip.

* * * * *